(12) United States Patent
Brintzinger et al.

(10) Patent No.: US 7,332,430 B2
(45) Date of Patent: Feb. 19, 2008

(54) METHOD FOR IMPROVING THE MECHANICAL PROPERTIES OF BOC MODULE ARRANGEMENTS

(75) Inventors: Axel Brintzinger, Dresden (DE); Octavio Trovarelli, Dresden (DE)

(73) Assignee: Infineon Technologies AG, Munich (DE)

( * ) Notice: Subject to any disclaimer, the term of this patent is extended or adjusted under 35 U.S.C. 154(b) by 13 days.

(21) Appl. No.: 10/826,601

(22) Filed: Apr. 16, 2004

(65) Prior Publication Data

US 2004/0259290 A1 Dec. 23, 2004

(30) Foreign Application Priority Data

Apr. 17, 2003 (DE) ................... 103 18 074

(51) Int. Cl.
| | |
|---|---|
| H01L 21/44 | (2006.01) |
| H01L 21/50 | (2006.01) |
| H01L 21/48 | (2006.01) |
| H01L 23/544 | (2006.01) |
| H01L 23/52 | (2006.01) |
| H01L 23/48 | (2006.01) |
| H01L 21/78 | (2006.01) |

(52) U.S. Cl. .............. 438/666; 438/113; 438/115; 257/620; 257/E23.021; 257/E21.599; 257/773; 257/737

(58) Field of Classification Search ............. 438/110, 438/113, 115, 613, 666; 257/620, 622, 737, 257/773, E21.599, E23.021

See application file for complete search history.

(56) References Cited

U.S. PATENT DOCUMENTS

| | | | |
|---|---|---|---|
| 5,650,667 A | 7/1997 | Liou | |
| 5,908,317 A * | 6/1999 | Heo | 438/617 |
| 5,933,713 A * | 8/1999 | Farnworth | 438/127 |
| 6,054,772 A * | 4/2000 | Mostafazadeh et al. | 257/781 |
| 6,063,647 A * | 5/2000 | Chen et al. | 438/108 |
| 6,181,569 B1 * | 1/2001 | Chakravorty | 361/761 |
| 6,187,615 B1 * | 2/2001 | Kim et al. | 438/113 |
| 6,198,169 B1 * | 3/2001 | Kobayashi et al. | 257/780 |
| 6,255,737 B1 * | 7/2001 | Hashimoto | 257/784 |
| 6,323,542 B1 * | 11/2001 | Hashimoto | 257/669 |
| 6,326,698 B1 * | 12/2001 | Akram | 257/781 |
| 6,339,251 B2 * | 1/2002 | Ha et al. | 257/620 |
| 6,352,881 B1 * | 3/2002 | Nguyen et al. | 438/108 |
| 6,420,776 B1 * | 7/2002 | Glenn et al. | 257/620 |
| 6,441,473 B1 * | 8/2002 | Deshmukh | 257/669 |
| 6,441,500 B1 | 8/2002 | Sumikawa et al. | |
| 6,472,249 B1 * | 10/2002 | Kuwabara | 438/106 |

(Continued)

FOREIGN PATENT DOCUMENTS

DE 196 41 730 A1 5/1997

(Continued)

*Primary Examiner*—Luan Thai
(74) *Attorney, Agent, or Firm*—Slater & Matsil, L.L.P.

(57) ABSTRACT

The invention relates to a method for improving the mechanical properties of BOC module arrangements in which chips have 3D structures, solder balls, μ springs or soft bumps which are mechanically and electrically connected by means of solder connections to terminal contacts on a printed circuit board or leadframe. Advantages are achieved by providing a casting compound for the wafer or the chips after they have been individually separated and before they are mounted on the printed circuit board in such a way that the tips of the 3D structures protrude from this compound. The casting compound preferably has elastic and mechanical properties comparable to those of silicon.

19 Claims, 2 Drawing Sheets

U.S. PATENT DOCUMENTS

| | | |
|---|---|---|
| 6,495,916 B1 | 12/2002 | Ohuchi et al. |
| 6,573,598 B2 * | 6/2003 | Ohuchi et al. ............... 257/734 |
| 6,673,649 B1 * | 1/2004 | Hiatt et al. ................. 438/105 |
| 6,790,758 B2 * | 9/2004 | Hsieh et al. ................. 438/612 |
| 6,885,101 B2 * | 4/2005 | Storli .......................... 257/737 |
| 6,885,108 B2 * | 4/2005 | Luo et al. .................... 257/778 |
| 6,897,568 B2 * | 5/2005 | Haimerl et al. ............. 257/779 |
| 6,916,684 B2 * | 7/2005 | Stepniak et al. ............ 438/108 |
| 2002/0066584 A1* | 6/2002 | Kurita ....................... 174/52.1 |
| 2003/0067755 A1 | 4/2003 | Haimerl et al. |

FOREIGN PATENT DOCUMENTS

| | | |
|---|---|---|
| DE | 100 45 043 A1 | 4/2001 |
| DE | 101 05 351 A1 | 8/2002 |
| DE | 10105351 A1 * | 8/2002 |
| DE | 101 26 296 A1 | 12/2002 |
| WO | WO 01/75969 A1 | 10/2001 |
| WO | WO 01/79589 A1 | 10/2001 |

* cited by examiner

METHOD FOR IMPROVING THE MECHANICAL PROPERTIES OF BOC MODULE ARRANGEMENTS

TECHNICAL FIELD

The invention relates generally to electronic devices and more particularly to a method for improving the mechanical properties of BOC module arrangements.

BACKGROUND

Board on chip (BOC) module arrangements are produced by a mounting process in which bond pads (contact areas) have first been provided on the active side of a chip either directly with solder balls or with other 3-dimensional (3D) structures from a solder material, or structures containing at least one solder material or the like, for example by printing or dispensing. The chip is subsequently positioned face down over the terminal contacts on a printed circuit board (PCB) and then attached under the effect of heat by soldering. In this operation, an electrical and at the same time mechanical connection takes place between the chip and the printed circuit board.

In the case of such BOC module arrangements it has proven to be disadvantageous, however, that considerable mechanical stresses may occur between the different materials of the chip and the printed circuit board during normal operation caused by the different coefficients of expansion of the chip and of the printed circuit board. This thermal mismatch may lead in long-term operation to the failure of the BOC module arrangement, in that for example one or more of the solder connections rupture due to mechanical overload. The consequence is then generally total failure of the component.

To eliminate or at least minimize such stress caused by a thermal mismatch, it has been the practice to use an underfiller with good flow properties, introduced between the chip and the printed circuit board by capillary action after the chip has been mounted on the printed circuit board.

The particular disadvantage of using such an underfiller is that the mounting of the chip on the printed circuit board has to be performed first, and only then can the underfiller be introduced. This means that each individual chip has to be stabilized by the underfiller after it has been mounted. This also has the result that the introduction of the underfiller is a very laborious procedure because every BOC arrangement has to be individually enhanced. It is also difficult to introduce the underfiller uniformly.

The problems of the mechanical strength of the connection between the chip and the printed circuit board are exacerbated if, instead of the relatively solid solder balls of a solder material, so-called soft solder balls of a mixture of an organic material and a solder material, or even 3-dimensional compliant elements are used as electrical and mechanical connecting elements. Several problems have to be simultaneously taken into consideration here.

The soft solder balls have by their nature a lower mechanical strength, so that the connection between the chip and the printed circuit board is less strong for this reason alone. It is even more problematic when compliant 3D elements are used. Here, a subsequent increase of the mechanical strength of the connection between the chip and the printed circuit board is particularly important because the compliant 3D elements consist of a compliant base element, on which an electrically conductive structure of metal is then applied. Here, the electrically conductive structure (reroute layer/wiring) cannot transfer any mechanical forces at all.

SUMMARY OF THE INVENTION

Aspects of the invention provide a BOC module arrangement which avoids disadvantages of the prior art and with which cost advantages can be achieved in mass production. The preferred embodiment of the invention relates to a method for improving the mechanical properties of BOC module arrangements, in which chips have 3D structures, solder balls, µ springs or soft bumps which are mechanically and electrically connected by means of solder connections to terminal contacts on a printed circuit board or leadframe.

In one aspect, a casting compound is provided for the wafer or the chips after they have been individually separated and before they are mounted on the printed circuit board in such a way that the tips of the 3D structures protrude from this compound.

This casting compound applied to the chip completely replaces the underfiller previously introduced after the mounting of the chips on a chip carrier, whereby faster mounting of the chips is made possible by simpler means, and at the same time adequate protection of the 3D structures is achieved.

If the casting compound is applied to the entire wafer over its surface area before the chips are individually separated, further time and cost advantages can be achieved in comparison with the individual coating of the chips. The casting compound may be advantageously applied uniformly by spraying, dispensing or printing.

In order to reduce to a great extent mechanical stresses caused by thermal influences, the casting compound should have elastic and mechanical properties comparable to those of silicon. Thus, a silicon-based material, or a thermoplastic material, may be used as the casting compound. An epoxy resin is also suitable as the casting compound. However, it is desirable for the material selected to have adequately good flow properties.

In a variant of the invention, the coating of the wafer may take place in two steps. The casting compound is first applied to the entire wafer in a layer thickness such that the 3D structures are also covered, and the layer thickness of the casting compound is subsequently reduced to the extent that the tips of the 3D structures protrude from the casting compound. The reduction of the layer thickness of the casting compound may be performed simply by thermal removal (an ashing step) or by etching.

Since the individual separation of the chips from the wafer assembly is made more difficult by the coating with the casting compound, it is expedient that the separation corridors between the chips are exposed before the separation of the latter. The exposing of the separation corridors may take place simply by means of customary photolithographic methods, or else by working with a laser beam.

In one particular variant of the invention, before cutting up (dicing) the wafer, it is cooled down to a temperature at which the casting compound is adequately brittle to allow the separation to be performed without the usual problems.

BRIEF DESCRIPTION OF THE DRAWINGS

The invention is to be explained in more detail below on the basis of an exemplary embodiment. In the associated figures of the drawing.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
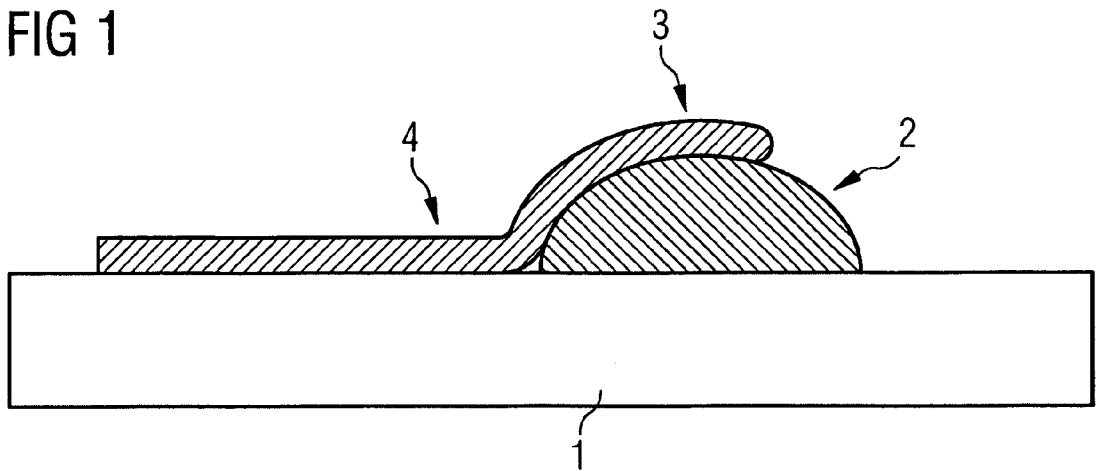
FIG. 1 shows a detail of a wafer with a 3D element and a redistribution layer (reroute wiring)
Figure 2:
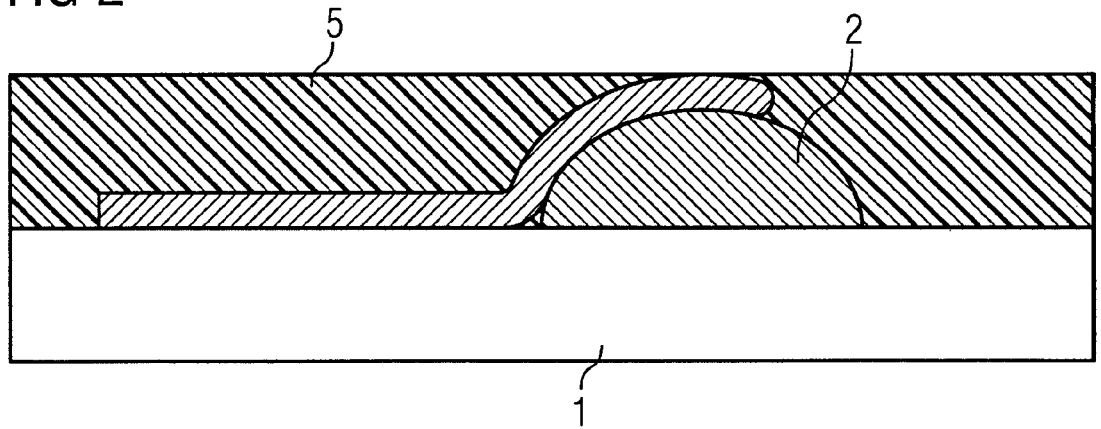
FIG. 2 shows the wafer according to FIG. 1 which has been provided with a casting compound which encloses the 3D element.
Figure 3:
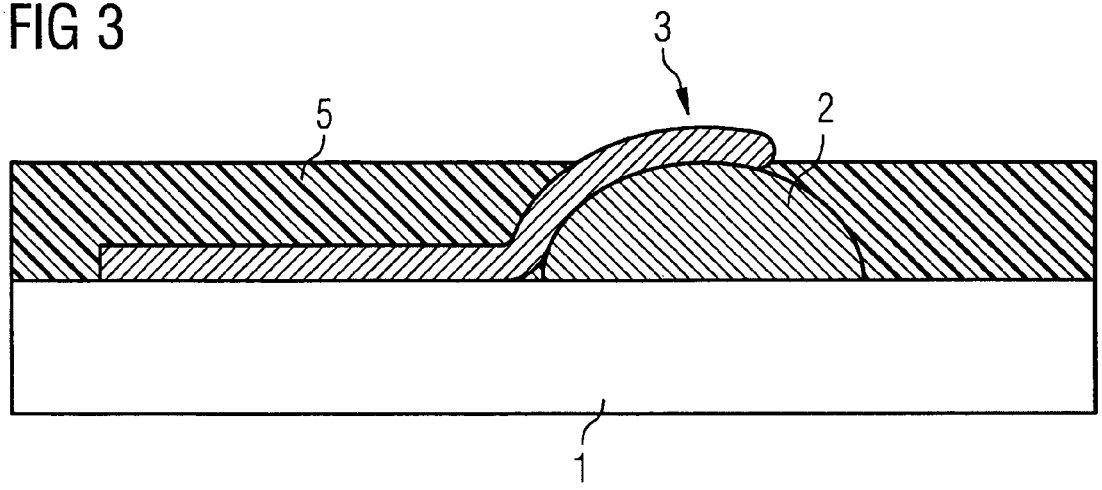
FIG. 3 shows the coated wafer after exposing the contact area of the 3D element.

FIG. 1 shows a detail from a wafer 1, on which a compliant 3D structure 2 is arranged. The structure 2 includes a tip having a contact area 3 that is a component part of a redistribution layer 4. Layer 4 electrically connects the contact area 3 to a terminal element (not shown) of the wafer 1. Instead of the compliant 3D structures, the wafer 1 may also be provided with solder balls, µ springs or soft bumps. In any event, however, the mechanical and electrical connection to a carrier element takes place by connections with the terminal contacts on a printed circuit board or a leadframe. This electrical and mechanical connection is preferably made by solder.

To improve the mechanical stability of the completed component (for example, a BOC component), the wafer 1 is provided with a casting compound 5 before it is separated into individual chips. The coating may in this case take place in such a way that the tips of the 3D structures 2 after coating with the casting compound 5 protrude from this compound, or in that the tips of the 3D structures 2 are covered and then subsequently exposed.

In principle, it is of course also possible to apply the casting compound 5 after the individual separation of the chips from the wafer 1. However, the individual coating of the separated chips is much more laborious than the coating of the entire wafer.

The casting compound 5 may be advantageously applied uniformly by spraying, dispensing or printing.

In order to reduce to a great extent mechanical stresses caused by temperature influences, the casting compound 5 should have mechanical and thermal properties comparable to those of silicon. Thus, a silicon-based material, or else a thermoplastic material, or epoxy resin can be advantageously used as the casting compound 5. In any case, it is desirable for the selected material to have adequately good flow properties.

The coating of the wafer 1 can also be performed in two steps. In this embodiment, the casting compound 5 is first applied to the entire wafer 1 in a layer thickness such that the 3D structures 2 are also completely (or at least mostly) covered. The layer thickness of the casting compound 5 is subsequently reduced to the extent that the tips of the 3D structures 2 protrude from this compound.

The reduction of the layer thickness of the casting compound 5 may be performed simply by thermal removal (an ashing step) or by etching.

Figure 4:
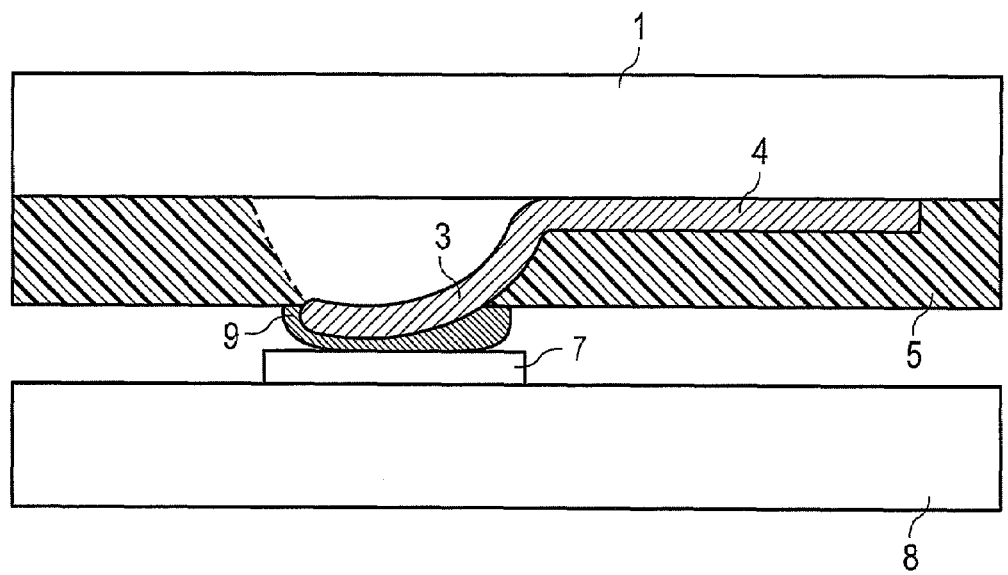
FIG. 4 shows the wafer being attached to a printed circuit board or lead frame.

After applying a casting compound 5, the connection area 3 can be electrically coupled to a terminal 7 of a second apparatus 8, as shown in FIG. 4. The second apparatus 8 can be a printed circuit board or a lead frame. The connection area 3 can be electrically coupled by soldering the connection area 3 to the terminal 7 with a solder material 9.

Figure 5:
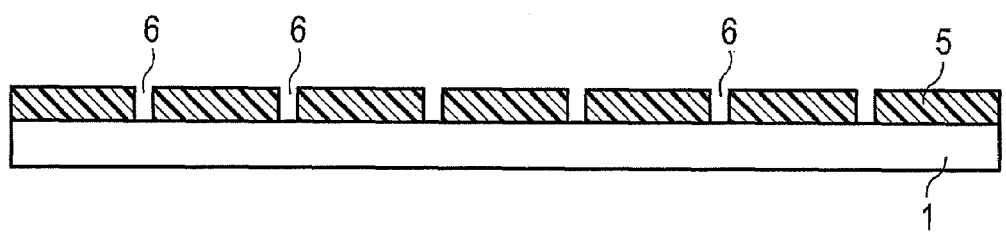
FIG. 5 shows a wafer with separation corridors.

Since the individual separation of the chips from the wafer assembly is made more difficult by the coating with the casting compound 5, it is expedient that the separation corridors 6 (e.g., scribe lines) between the chips are exposed before the separation of the latter from the wafer 1. This procedure, which is illustrated in FIG. 5. may take place by means of customary photolithographic methods, or else by working with a laser beam.

If the wafers 1 are separated by working with a laser, it is possible to dispense with the prior exposure of the separation corridors 6.

If a material which becomes brittle at relatively low temperatures is used as the casting compound 5, the wafer 1 may be cooled before cutting up (dicing) down to a temperature at which the casting compound is adequately brittle. The separation can subsequently be performed without the usual problems.

What is claimed is:

1. A method of manufacturing a module, the method comprising:

providing a semiconductor wafer that includes a connection area extending over a top surface of the semiconductor wafer, wherein the connection area comprises a compliant 3D structure that includes a conductor overlying a compliant base element, the conductor being integral with a redistribution layer that overlies the semiconductor wafer;

applying a casting compound over the top surface of the semiconductor wafer;

after applying a casting compound, reducing a thickness of the casting compound so that the connection area protrudes through the casting compound;

after applying the casting compound, exposing separation corridors on the semiconductor wafer by removing portions of the casting compound; and after exposing separation corridors, separating the wafer into a plurality of individual chips.

2. The method of claim 1, further comprising, after applying the casting compound, mounting the module to a printed circuit board.

3. The method of claim 1, further comprising, after forming the casting compound, attaching the module to a lead frame.

4. The method of claim 1, wherein the separation corridors are exposed by a photolithographic process.

5. The method of claim 1, wherein the separation corridors are exposed with use of a laser beam.

6. The method of claim 1, wherein the casting compound is cooled before separating the wafer into a plurality of individual chips.

7. The method of claim 1, wherein the casting compound is applied uniformly by spraying, dispensing or printing.

8. The method of claim 1, wherein the casting compound has thermal and mechanical properties comparable to those of silicon.

9. The method of claim 8, wherein the casting compound comprises a silicon-based material.

10. The method of claim 8, wherein the casting compound comprises a thermoplastic material.

11. The method of claim 8, wherein the casting compound comprises an epoxy resin.

12. The method of claim 1, wherein the thickness of the casting compound is reduced by thermal removal.

13. The method of claim 1, wherein the thickness of the casting compound is reduced by etching.

14. The method of claim 1, further comprising, after applying a casting compound, electrically coupling the connection area to a terminal of a second apparatus.

15. The method of claim 14, wherein electrically coupling the connection area comprises soldering the connection area to the terminal.

16. The method of claim 1, wherein separating the wafer into a plurality of individual chips comprises using a laser to separate the wafer.

17. A method for improving the mechanical properties of a BOC module arrangement in which chips have 3D structures which are mechanically and electrically connected by means of solder connections to terminal contacts on a printed circuit board or leadframe, the method characterized in that a casting compound is applied over a top surface of a semiconductor wafer, and excess thickness of the casting compound is removed, in such a way that tips of the 3D structures protrude from the compound, wherein the 3D structures comprise compliant 3D structures each of which includes a conductor overlying a compliant base element, the conductor being integral with a redistribution layer that overlies the top surface of the semiconductor wafer, and wherein the after the casting compound is applied, exposing separation corridors by removing portions of the casting compound, and wherein after the exposing the separation corridors, separating the semiconductor wafer into chips.

18. The method of claim 17, wherein the conductor comprises metal.

19. The method of claim 17, wherein the chips comprise individual semiconductor dies.

* * * * *